(12) United States Patent
Carter et al.

(10) Patent No.: US 6,639,305 B2
(45) Date of Patent: Oct. 28, 2003

(54) SINGLE LAYER SURFACE MOUNT PACKAGE

(75) Inventors: Jerry L. Carter, Pomona, CA (US); Timothy J. Going, Olivenhain, CA (US)

(73) Assignee: StratEdge Corporation, San Diego, CA (US)

( * ) Notice: Subject to any disclaimer, the term of this patent is extended or adjusted under 35 U.S.C. 154(b) by 0 days.

(21) Appl. No.: 10/066,018

(22) Filed: Feb. 1, 2002

(65) Prior Publication Data

US 2002/0106835 A1 Aug. 8, 2002

Related U.S. Application Data

(60) Provisional application No. 60/266,265, filed on Feb. 2, 2001.

(51) Int. Cl.[7] .................. H01L 23/495; H01L 23/12
(52) U.S. Cl. .................. 257/666; 257/676; 257/701; 257/704
(58) Field of Search ................ 257/666, 667, 257/668, 675, 676, 677, 701, 702, 703, 704, 705

(56) References Cited

U.S. PATENT DOCUMENTS

| | | | | |
|---|---|---|---|---|
| 3,404,319 A | * | 10/1968 | Tsuji et al. | ............... 317/234 |
| 4,298,769 A | * | 11/1981 | Richman | ............... 174/52 FP |
| 4,901,041 A | | 2/1990 | Pengelly | |
| 5,227,583 A | | 7/1993 | Jones | |
| 5,448,826 A | | 9/1995 | Goetz et al. | |
| 5,465,008 A | | 11/1995 | Goetz et al. | |
| 5,483,740 A | * | 1/1996 | Maslakow | ................... 29/827 |
| 5,559,364 A | * | 9/1996 | Hojyo | ................... 257/666 |
| 5,736,783 A | | 4/1998 | Wein et al. | |
| 5,753,972 A | | 5/1998 | Wein et al. | |
| 5,844,307 A | * | 12/1998 | Suzuki et al. | ............... 257/690 |
| 5,877,561 A | * | 3/1999 | Kim | ............... 257/796 |
| 5,936,303 A | * | 8/1999 | Nishi | ............... 257/675 |
| 6,028,350 A | * | 2/2000 | Sabyeying | ............... 257/670 |
| 6,172,412 B1 | | 1/2001 | Wein et al. | |
| 6,271,579 B1 | | 8/2001 | Going et al. | |

* cited by examiner

*Primary Examiner*—Kamand Cuneo
*Assistant Examiner*—Scott B. Geyer
(74) *Attorney, Agent, or Firm*—Kilpatrick Stockton LLP

(57) ABSTRACT

A single layer surface mount package suitable for use with a high frequency microelectronic device includes a lead frame partially embedded in a dielectric material and a lid. The dielectric material is integrally formed or molded into the cavities between the leads and die attach area of the lead frame such that at least the die attach area remains exposed on the top and the bottom surface of the dielectric material. A sufficient length of each lead remains exposed beyond the perimeter of the dielectric material for surface mounting to a circuit of a next level assembly.

22 Claims, 2 Drawing Sheets

SINGLE LAYER SURFACE MOUNT PACKAGE

CROSS-REFERENCES TO RELATED APPLICATIONS

This application claims the benefit of priority of U.S. provisional application Ser. No. 60/266,265, filed Feb. 2, 2001 which is incorporated herein by reference in its entirety.

FIELD OF THE INVENTION

The present invention generally relates to the field of packages for high frequency electronic devices, and specifically relates to a single layer surface mount package having a lead frame partially embedded in a dielectric material and covered by a cap for housing a high frequency electronic device, and for mounting and connecting the high frequency electronic device to a circuit.

BACKGROUND OF THE INVENTION

Integrated circuit technologies continue to advance producing devices with higher speeds, frequencies, powers, and functional complexity. These attributes are realized with smaller and smaller electronic devices by effective control and management of wafer-scale interconnect technology. An important component of integrated circuit technologies is the packaging for these high performance electronic devices. In addition to providing a transparent transition from the electronic device to a next level of assembly, such as a circuit board, packages must be suitable for cost-effective surface mounting methods which utilize highly automated systems to assemble the circuit boards.

As the frequencies and/or the speeds of the electronic devices increase, the available packaging becomes the chief inhibitor to electrical response. Very high frequency signals degrade as the signals attempt to propagate through the electrical constructions and interconnects of the packages. Impedance discontinuities caused by the leads, and interconnections between the leads and mating lead pads on the package and on the next level of assembly cause unacceptable signal distortions. The signals also encounter cavity resonances or waveguide modes fostered by the structural configurations of the packages. Due to these packaging deficiencies, very few, if any, of the available surface mounting packages are capable of efficient transmission of signals higher than a few Gigahertz in frequency.

Packages of the prior art that address the signal performance problems described above are typically formed from several layers including a conductive base, a ceramic circuit substrate, a ceramic seal ring substrate and a lid as disclosed in U.S. Pat. No. 5,465,008 of Goetz et al. and U.S. Pat. No. 5,735,972 of Wein et al. These packages utilize one or a combination of microstrip transmission lines, stripline transmission lines, and embedded microstrip lines to provide a conductive path from the electronic device to the edge of the package for wire-bonding to the next level of assembly. Microstrip transmission lines are conductors above a ground plane separated from the ground plane by a dielectric. The impedance of a microstrip transmission line is a function of the dielectric, the line width, and the thickness of the dielectric. Stripline transmission lines are conductors through a dielectric placed between two ground planes. The impedance of a stripline transmission line is a function of the dielectric, the line width, and the thickness of the dielectric above and below the conductor. Embedded microstrips are similar to the stripline transmission lines, but do not include the top ground plane. These transmission line types are formed on the circuit substrate of the package to provide a connection from the electronic device to the edge of the package which minimizes signal degradation. The transmission lines are precisely dimensioned to provide a continuous 50 ohm impedance.

The prior art packages minimize signal degradation utilizing multiple layers of dielectric substrates, a series of conductive elements to form transmission lines on at least one of the dielectric substrates, and an internal ground plane. The multiple layers are bonded together in a complicated manufacturing process to form the high frequency package which must be hand assembled onto the next level assembly circuit after the low frequency devices are surface mounted to the circuit. Thus, the manufacturing steps are numerous, complicated, costly and time consuming.

FIGS. 1a and 1b illustrate a top and a bottom view, respectively, of an improved prior art package 10 utilizing the embedded microstrip construction which may be surface mounted onto a circuit. The surface mount package 10 includes a conductive lead frame 14 attached to the bottom of a dielectric or ceramic ring 12. The lead frame 14 consists of an array of leads 20 and a die attach or ground plane portion 24 which, typically, is centered with a cavity 22 of the dielectric ring 12. The dielectric ring 12 includes conductive traces 26 which are formed on the top of the dielectric ring 12 and extend from the cavity 22 to the sides of the of the dielectric ring 12. A chip or electronic device (not shown) is placed inside a cavity 22 of the dielectric ring 12, and the electronic device is connected to the conductive traces 26 by wire bonds.

Each conductive trace 26 used for transmission of signals to or from the electronic device typically includes a conductive pad area 16 which is wider than the trace 26 for the purpose of impedance matching of the transmission line between the packaged electronic device and the circuit. The leads 20 on the bottom of the ceramic body 12 make electrical connections to the conductive pads 16 by means of circular open vias, or half vias 18, on the sides of the ceramic body 12. Following placement of a electronic device in the cavity 22, a ceramic lid (not shown) is bonded to the top side of the ceramic ring 12 to cover the electronic device within the cavity 22. The lid, the conductive traces 26 and pads 16 and the ground plane portion 24 of the lead frame 14 form embedded microstrips of the prior art package 10.

The surface mount package 10 of the prior art illustrated in FIGS. 1a and 1b addresses the concerns of transmission of signals for high frequency devices and has fewer layers than the typical multi-layered package. The die attach area 24 serves as the ground plane when the package 10 is surface mounted to the ground plane of the next higher assembly. Although the surface mount package 10 eliminates the need for the individual connection and insertion of the package onto the next level assembly, this surface mount package 10 still requires a number of difficult manufacturing steps to complete the package, e.g., forming the ceramic body 12 with the half vias 18, forming the conductive traces 26 on the ceramic body, matching impedances by exact dimensioning of the pads 16 and conductive traces 26, etc. The manufacturing steps required for these packages 10 are time-consuming and expensive, and may negatively impact the reliability of the device.

Therefore, a need remains for an easy-to-manufacture surface mountable microelectronic package which allows attachment of both low frequency and high frequency devices by the same, low cost surface mounting techniques, and that does not present deficiencies of the above-described prior art packages.

SUMMARY OF THE INVENTION

It is an advantage of the present invention to provide a single layer surface mount package suitable for low frequency as well as very high frequency electronic devices.

Another advantage is to provide a single layer surface mount package consisting of a lead frame embedded in a dielectric that is easy to manufacture and that is capable of efficient transmission of signals higher than a few Gigahertz in frequency.

It is yet another advantage to provide an economical method for manufacturing a surface mount package that eliminates the need for producing multiple shaped substrates, forming conductive traces on at least one of the substrates, and positioning and bonding the substrate layers.

In an exemplary embodiment of the present invention, a surface mount package suitable for high-frequency electronic devices consists of a single base layer for holding an electronic device and a cap for covering the electronic device. The single base layer includes a conductive lead frame having an outside frame portion, a die attach portion, and any desired number of leads for connection to the next assembly level circuit. The leads are attached to the outside frame portion and extend inward so that they are adjacent to but do not touch, the die attach portion. At least one of the leads is connected to the die attach portion which has sufficient area for supporting an electronic device, and which typically acts as a ground plane. A dielectric material is formed, poured or molded between the leads and the die attach portion of the lead frame to produce the single base layer such that the lead frame is exposed on both the top and the bottom sides of the single base layer. In another embodiment of the exemplary embodiment, the dielectric material is formed to cover the leads on the bottom side of the base layer such that only the die attach portion is exposed. An electronic device sits on the die attach portion on the top side of the base layer, and the signal lines of the electronic device are bonded, e.g., wire-bonded to an adjacent lead. The cap or lid is bonded directly to the base layer to enclose the electronic device.

The leads of the surface mount package of the exemplary embodiment may be surface mounted onto the circuit of the next level assembly with other high or low frequency surface mountable devices. The next level assembly incorporates the necessary impedance matching for the single layer surface mount package leads as well as the ground plane for the die attach portion of the package. Thus, the present invention eliminates the need for special manufacturing of multiple package layers, including separate ground planes, special formation of traces for impedance matching, and separate attachment of the package to the next level assembly.

In an exemplary method of manufacturing the surface mount package of the present invention, the leads and the die attach, or center, portion of a lead frame are placed inside a mold or injection molding device. A suitable dielectric material, such as a ceramic, is formed around a first length of the leads and the die attach portion to produce a single base layer. The term "form" is used herein to indicate any suitable method of molding the dielectric material including melting of a power or a preform, injecting or pumping of liquid into a form, sintering of powder in place, or reactive curing of a martial. A second length of the leads, which are attached to the outside frame portion, remain fully exposed to serve as the package leads for bonding to the next assembly level circuit. The thickness or height of the molded dielectric material matches the thickness of the lead frame such that the leads and center base portion are exposed on the upper and lower sides of the single layer surface mount package of the exemplary embodiment. Alternatively, the dielectric is minimally thicker than the lead frame to cover the leads on the bottom surface of the package. An electronic device is placed on the top surface of the die attach portion of the base layer, and the signal lines of the electronic device are attached to the leads using, e.g., wire bonding techniques. A cap is placed over the electronic device and bonded directly to the single base layer. The outside frame portion is removed from the lead frame so that the packaged electronic device is ready for surface mounting on the circuit of the next level assembly.

In a second exemplary embodiment, the dielectric material is molded into the lead frame and includes a dielectric ring projecting to a desired height above the top surface of the lead frame. The raised dielectric ring provides a cavity for accepting the electronic device. The dielectric ring is molded along the perimeter of a predetermined package edge and has a ring width such that an inside portion of the leads as well as the die attach area remain exposed. A flat lid or a cap may then be utilized as a package cover and bonded directly to the raised dielectric ring. The raised dielectric ring adds additional protection for the enclosed electronic device as well as added structural support for the package. The use of a simple flat lid is often less expensive, and may be of particular advantage if the package requires an optical window to close it. An optical lid may be a simple flat optical plate of glass, sapphire, or a material which is sufficiently transparent to the portion of the spectrum of interest.

In other exemplary embodiments, the projecting dielectric ring may be of any desired height and width as long as a sufficient area of the die attach area remains exposed for accepting the electronic device, and a portion of the leads remain exposed for a connection to the signal lines of the electronic device.

The exemplary embodiments of the single layer surface mount leaded packages, as described above, provide innovative improvements over the prior art packages. The single layer surface mount leaded package is universal in that it accepts both low frequency and high frequency devices. A single layer, multi-use package allows circuit manufactures to minimize inventory requirements. The complexity of the package is reduced dramatically requiring only a lead frame embedded in a dielectric and a cap. The use of fewer package elements permits efficient and cost-effective production of the packages. In addition, the configuration of a dielectric formed into the lead frame provides the package leads with mechanical stability that is not present in the prior art inventions.

Further advantages of the inventive package of the exemplary embodiments are realized in the reduced size of the package. The leads of prior art packages are separated by air or by vacuum. A sufficiently large separation is required to prevent interference between the signals on adjacent leads. In contrast, the surface mount leaded package of the exemplary embodiment may be constructed to have a footprint only slightly larger than that of the enclosed electronic device because the dielectric molded between the leads provides a higher resistance as compared to the air or vacuum separation.

The method of molding the dielectric around the lead frame also provides a comparatively easy means for adjusting the geometry of the leads to the particular application either within the circuit or to the external next level of assembly as any desired configuration of the lead frame can be utilized in the molding process. Finally, those skilled in the art of transmission line design will recognize that the electrical performance at high frequencies may be realized for any enclosed electronic device by adjusting the geometry of the electrical traces within the pattern of the leads.

BRIEF DESCRIPTION OF THE DRAWINGS

The present invention will be better understood from the following detailed description of an exemplary embodiment of the invention, taken in conjunction with the accompanying drawings in which like reference numerals refer to like parts and in which:

FIG. 2b is a top view of FIG. 2a;

FIG. 2c is a side view of the package of FIG. 2a;

FIG. 3b is a top view of FIG. 3a;

FIG. 3c is a side view of the package of FIG. 3a;

FIG. 4b is a top view of FIG. 4a; and

FIG. 4c is a side view of the package of FIG. 4a.

DETAILED DESCRIPTION OF THE DRAWINGS

Figure 1A:
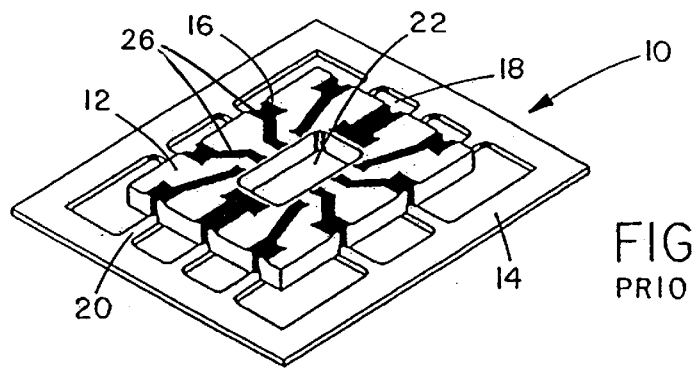
FIG. 1a is a top view of a prior art surface mount package.
Figure 1B:
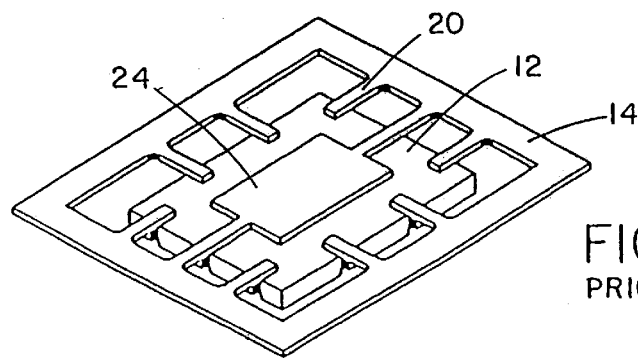
FIG. 1b is a bottom view of the prior art package of FIG. 1.
Figure 2A:
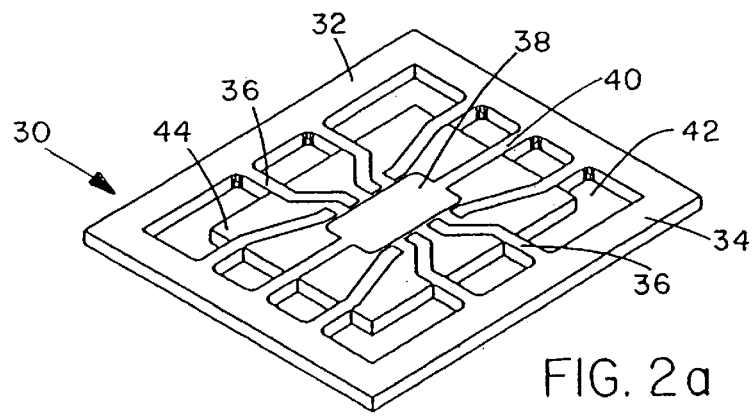
FIG. 2a is a perspective view of the package of the preferred embodiment.

FIG. 2a is a perspective view of the single layer surface mount package 30 of the preferred embodiment. The single base layer of the surface mount package 30 is formed from a conductive lead frame 32 embedded in a dielectric material 44. The dielectric material 44 of the preferred embodiment is a glass material filled with powdered ceramic. A typical glass filled composition is Corning formulation 7052 or an equivalent glass, filled with 25% by weight of alumina powder, however any suitable dielectric material may be utilized to form the single base layer. The lead frame 32 may include a central, or die attach area 38 and multiple leads 36 which radiate outward from the die attach area 38. The die attach area 38 supports the electronic device (not shown), and also may serve as the ground plane for the package 30. The leads 36 preferably are position relative to each other and relative to the die attach area 38, if one is present, to optimize electrical performance in the frequency area of interest, and to maintain ease of attachment to the circuit. Wire bonding, flip chip or other means of attachment to the leads 36 is chosen to minimize the signal loss and distortion from the chip to the external circuit.

In the preferred embodiment, two of the leads 40 are connected to the die attach area 38 to provide a connective path to a ground plane of the circuit of the next level assembly. The lead frame of the preferred embodiment is constructed from a low expansion alloy per ASTM F-15 (Iron Nickel Cobalt alloy) with plating of nickel followed by gold over all exposed metal surfaces. Other suitable conductive materials known in the art may be utilized for the construction of the lead frame. The lead frame construction may vary according to the requirements of the electronic device. Thus, any number of leads in any configuration may be utilized in the lead frame of the single layer surface mount package.

Figure 2B:
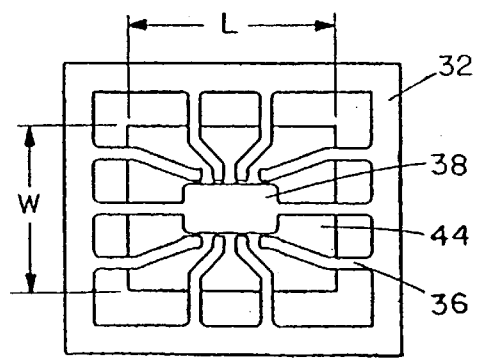
Figure 2C:
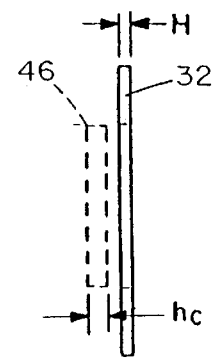

As shown in FIGS. 2a and 2b, the dielectric material 44 is formed around the leads 36, 40 and the die attach area 38, and has a length L and a width W. As shown in FIG. 2c, the dielectric material 44 is molded within the height H of the dielectric frame 32 to form a flat surface on the top and bottom surfaces of the package 30. In alternate embodiments of the single layer package 30, the dielectric material 44 is formed to cover the leads 36, 40 on the bottom surface of the package 30, while leaving the die attach area 38 exposed. Covering the leads 36, 40 with the dielectric material 44 is useful for preventing shorts between the leads 36, 40 when the package 30 is surface mounted to the circuit of the next level assembly.

Continuing with FIGS. 2a and 2b, unfilled cavities 42 remaining around the inside periphery of the lead frame 32 provide a portion of the leads 36, 40 that extend beyond the dielectric material 44 for attachment to the circuit of the next level assembly. Once the dielectric material 44 is molded around the leads 36, 40 and die attach portion 38 of the lead frame, the outside ring 34 of the lead frame 32 may be removed from the package 30. The length of the leads 36, 40 of the preferred embodiment are standardized for use with a variety of electronic devices and circuit assemblies. This allows the circuit manufacturer to design the next level assembly with a correct footprint for surface mounting the package 30 to the circuit board. Because the leads 36, 40 are fully exposed on the bottom of the package 30, the leads 36, 40 need not extend beyond the dielectric material as the circuit card footprint for each lead may be extended under the package to align with the lead. This allows for the actual length of the package lead from the chip to the board to be very short, and essentially flat within the thickness of the lead. The short flat lead allows easy optimization of the lead as a transmission line for efficient high frequency circuits. This is also particularly useful to allow the package to occupy as little space as possible on the circuit board.

In one embodiment of the invention, the dielectric material 44 which forms the edge of the package 30 has a length L of 0.180 inches and a width W of 0.140 inches. The die attach area 38 is 0.082 inches by 0.042 inches. However, the dimensions of the package 30 may be designed to optimize electrical performance of the enclosed electronic device. In addition, the package 30 may be designed for standard outlines which allows the package to be utilized for a variety of electronic devices, and on circuits utilizing standard surface mount footprints.

FIG. 2c illustrates a side view of the package 30 of FIG. 2a. A cap 46 having a cap height $h_c$ is bonded to the leads 36, 40 and the dielectric material 44 of the base layer. The cap 46 of the preferred embodiment extends to the edges of the dielectric material 44. However, the cap 46 may have dimensions of any length and width sufficient to cover the electronic device.

Figure 3A:
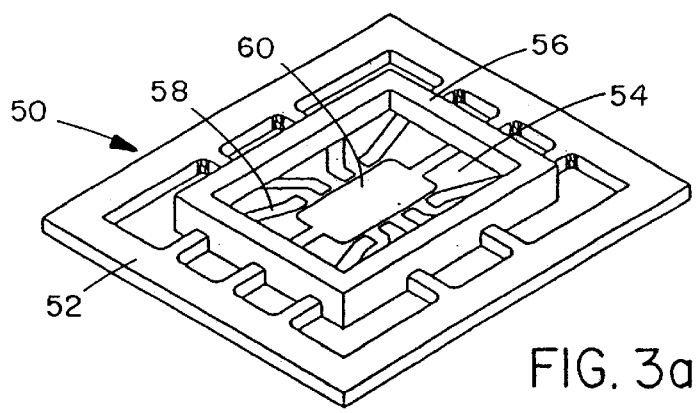
FIG. 3a is a perspective view of a second embodiment of the surface mount package.
Figures 3B, 3C:
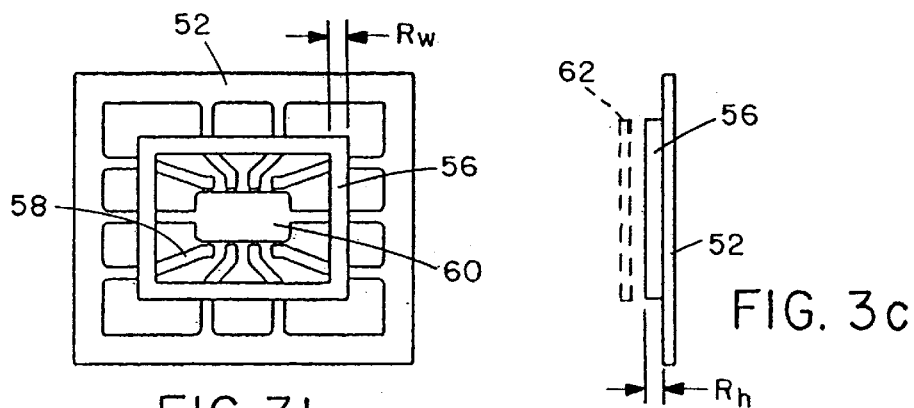

FIG. 3a is a perspective view of second embodiment of a single layer package 50 of the present invention. The dielectric material 54 is formed between the leads 58 and die attach area 60 of a lead frame 52. In addition, the dielectric material 54 is molded to incorporate a dielectric ring 56 which is raised above the surface of the lead frame 52 by a ring height $R_h$, as shown in FIG. 3c. The formation of the dielectric ring 56 provides a protective cavity for the electronic device (not shown). A cap or lid 62 may be bonded to the dielectric ring 56 to cover the electronic device. Referring to FIG. 3b, the ring width $R_w$ may vary as preferred as long as a portion of the embedded leads 58 remain exposed for connection to the signal lines of the electronic device.

Figure 4A:
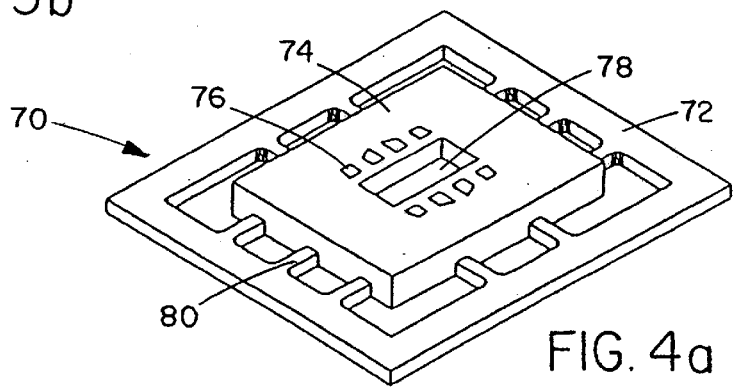
FIG. 4a is a perspective view of a third embodiment of the surface mount package.
Figures 4B, 4C:
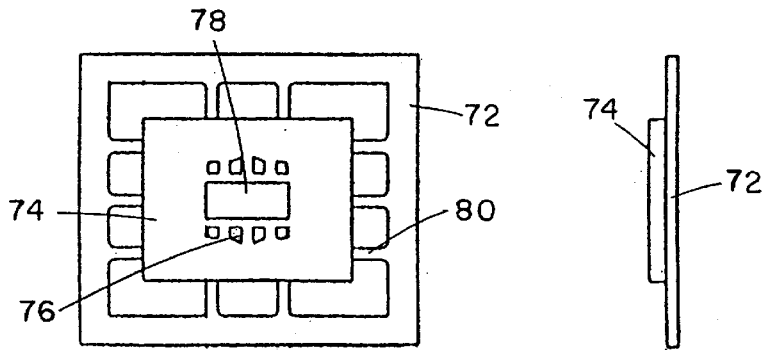

FIGS. 4a, 4b, and 4c illustrate a third embodiment of the single layer surface mount package 70 in which the dielectric ring width $R_w$ is maximized. In this embodiment the dielectric material 74 projects above the surface of the lead frame 72 and fully covers the leads 80. A cavity remains above at least a portion of the die attach surface 78 for accepting an electronic device (not shown). Open vias 76 of any preferred size or shape are positioned above each lead adjacent the die attach surface 78. The vias 76 are necessary for attaching the signal lines of the electronic device to the leads 80. In another embodiment of the invention, the leads 80 may be deflected up from the bottom plane of the package 70 in a slight 'dog-leg' bend. In this embodiment, connection areas 76 are where the top surface of the lead frame is just flush and exposed on the top surface of the dielectric 74. The dog leg bend of the leads 80 is designed to be a very smooth easy bend to minimize the high frequency distortion of the signal.

In a preferred method of manufacturing the single layer surface mount package 30 for connection to a circuit of a next level assembly (not shown), a lead frame 32 having multiple leads 36, including at least one lead 40 connected to a center die attach area 38, is formed from a suitable conductive material. The multiple leads 36 extend from positions adjacent the die attach area 38 to an outside ring of the lead frame 32. Dielectric material 44 is molded into a central portion of the lead frame 32, which includes at least a portion of the length of the leads 36, 40 and the die attach area 38, to form a base layer. The dielectric material 44 is restricted to a height equal to that of the height H of the lead frame 32 to provide a flat top and bottom surface of the base layer. In the preferred methods the leads 36 and the die attach area 38 are exposed on both the top and bottom surfaces. In another embodiment of the preferred method, the dielectric material is molded to cover the leads 36, 40 on the bottom surface of the base layer. An electronic device (not shown) is placed on the die attach area 38. The signal lines of the electronic device are connected to the leads 36 adjacent the die attach area 38. A cap 46 is placed on the top surface of the base layer and is bonded to the base layer utilizing any of several attachment methods know in the art, such as epoxy, or other adhesive. Lastly, the outside ring 34 of the lead frame 32 is detached from the lead frame.

In a preferred embodiment of fabrication of the dielectric, a sintered block of ceramic filled glass is placed into a carbon mold with the lead frame. The mold is passed through a furnace, and the glass is forced down into the mold by the flow of gravity, and by the weight of another block of carbon upon the glass block. Other methods of fabrication include conventional injection molding or transfer molding of an organic plastic such as filled Nylon, or phenolic, or epoxy, and simple casting of an epoxy or similar hardening plastic around the lead frame.

The completed single layer surface mount package 30 may be attached by any suitable means, e.g., surface mounting, to a circuit of a next level assembly (not shown). The circuit of the next level assembly is pre-designed to include a ground plane for connection to the die attach area 38. The circuit also includes circuit traces for connection to the leads 36 that are pre-designed to provide a 50 ohm impedance for the input and output signal lines of the electronic device.

In a second preferred method of manufacturing the single layer surface mount package 50, 70, a lead frame 52, 72 is provided having multiple leads 58, 80 and a center die attachment area 60, 78. Dielectric material 54, 74 is formed between the leads 58, 80 and die attachment area 60, 78 so that the dielectric is flush with the bottom surface of the lead frame 52, 72. The dielectric material 54, 74 is formed to include a ring projection 56, 74 above the top surface of the lead frame 52, 72. The ring projection has a ring width $R_w$ that may cover all of, or a portion of, the embedded leads 58, 80. The die attachment area 60, 78 and any exposed portion of the embedded leads 58, 80 form a cavity for accepting an electronic device (not shown). If the dielectric ring width $R_w$ extends to the edge of the center die attachment area 60, 78 such that the leads 58, 80 are fully embedded, the method further includes the step of providing vias through the dielectric material 54, 74 to each of the leads 58, 80. A lid or cap 62 is provided with the single layer surface mount device 50, 70 for attachment to the dielectric ring projection 56, 74.

Although exemplary embodiments of the invention have been described above by way of examples only, it will be understood by those skilled in the field that modifications may be made to the disclosed embodiments without departing from the scope of the invention, which is defined by the appended claims.

We claim:

1. A surface mount package for enclosing an electronic device comprising:
    a base layer comprising:
        a lead frame having a top surface and a bottom surface, comprising;
            a center die attach area for supporting the electronic device on the top surface and for providing a ground plane connection;
            a plurality of leads adjacent to and extending outward from the center die attach area, wherein each lead of the plurality of leads is connected to a signal line of a plurality of signal lines of the electronic device;
        a dielectric material integrally formed around the plurality of leads and the center die attach area, wherein the top surface and the bottom surface of the lead frame corresponding to the center die attach area are exposed; and
    a cover for enclosing the electronic device.

2. The surface mount package of claim 1, wherein the dielectric material and the lead frame have the same height such that the base layer has a flat upper surface and a flat lower surface.

3. The surface mount package of claim 2, wherein the bottom surface corresponding to the plurality of leads and the top surface of the lead frame are exposed.

4. The surface mount package of claim 1, wherein the plurality of leads on the bottom surface of the lead frame are covered by dielectric material.

5. The surface mount package of claim 2, wherein the lead frame has a thickness of 0.010 inches.

6. The surface mount package of claim 2, wherein the base layer has a length of 0.140 inches and a width of 0.180 inches.

7. The surface mount package of claim 2, wherein the center die attach area a length of 0.042 inches and a width of 0.082 inches.

8. The surface mount package of claim 1, wherein the dielectric material is integrally formed to further include a dielectric ring around a perimeter of the dielectric material that is elevated by a ring height above the top surface of the lead frame.

9. The surface mount package of claim 8, wherein the dielectric ring covers a first portion of the plurality of leads on the top surface of the lead frame such that a second portion of the leads and the center die attach area remain exposed.

10. The surface mount package of claim 8, wherein the cover is a flat lid.

11. The surface mount package of claim 8, wherein the dielectric ring covers the plurality of leads on the top surface of the lead frame such that only the center die attach area remains exposed.

12. The surface mount package of claim 11, wherein the dielectric ring further comprises a plurality of vias extending through the ring height to the plurality of leads.

13. The surface mount package as claimed in claim 1 wherein the dielectric is formed of ceramic material.

14. A surface mount package comprising:
   a lead frame comprising a center die attach area adapted for attachment of an electronic device thereto and a plurality of leads adjacent to and extending from the center die attach area, the lead frame having a top surface and a bottom surface;
   a dielectric material integrally formed around the lead frame, wherein each of the top surface and bottom surface of the lead frame corresponding to the center die attach area is exposed through the dielectric material for electrical connection thereto; and
   a cover for enclosing the electronic device after the electronic device is attached to the top surface of the center die attach area.

15. The surface mount package of claim 14, wherein the dielectric is formed flush with the top surface and bottom surface of the lead frame.

16. The surface mount package of claim 14, wherein the dielectric is formed flush with the bottom surface of the lead frame and the dielectric further comprises a ring projection extending above the top surface of the lead frame, wherein the ring projection defines a cavity adapted for receiving the electronic device.

17. The surface mount package of claim 16, wherein the ring projection has a plurality of vias formed therethrough for electrical connection to the plurality of leads.

18. The surface mount package of claim 14, wherein the lead frame further comprises at least one ground lead connected to and extending from the center die attach area.

19. The surface mount package of claim 14, wherein the dielectric is formed flush with the first, second and third bottom surfaces and the dielectric further comprises a ring projection extending above the first, second and third top surfaces, wherein the ring projection defines a cavity adapted for receiving the electronic device.

20. The surface mount package of claim 19, wherein the ring projection has a plurality of vias formed therethrough for electrical connection to the plurality of signal leads.

21. A surface mount package comprising:
   a center die attach area having a first top surface and a first bottom surface, the first top surface adapted for attachment of an electronic device, wherein the center die attach area is adapted for connection to a ground plane;
   a plurality of signal leads adjacent to and extending outward from the center die attach area, the plurality of signal leads having a second top surface and a second bottom surface;
   at least one ground plane lead connected to and extending outward from the center die attach area, the at least one ground plane lead having a third top surface and a third bottom surface;
   a dielectric material integrally formed around the center die attach area, the plurality of leads, and the at least one ground plane lead wherein each of the first top surface and first bottom surface is exposed through the dielectric material; and
   a cover for enclosing the electronic device on the first top surface of the center die attach area after attaching the electronic device thereto.

22. The surface mount package of claim 21, wherein the dielectric is formed flush with each of the first, second and third top surfaces and first, second and third bottom surfaces.

* * * * *